United States Patent

Scudiere et al.

[11] Patent Number: 5,987,342
[45] Date of Patent: *Nov. 16, 1999

[54] LAMINATED SUPERCONDUCTING CERAMIC TAPE

[75] Inventors: John D. Scudiere, Bolton; David M. Buczek, Needham; Gregory L. Snitchler, Shrewsbury; Paul J. Di Pietro, Arlington, all of Mass.

[73] Assignee: American Superconductor Corporation, Westboro, Mass.

[ * ] Notice: This patent issued on a continued prosecution application filed under 37 CFR 1.53(d), and is subject to the twenty year patent term provisions of 35 U.S.C. 154(a)(2).

[21] Appl. No.: 08/705,811

[22] Filed: Aug. 30, 1996

[51] Int. Cl.$^6$ .............................. H01B 12/02; H01L 39/00
[52] U.S. Cl. ..................... 505/230; 505/236; 505/237; 505/701; 505/704; 505/705; 505/231; 174/125.1; 428/212; 428/457; 428/469; 428/702; 428/930
[58] Field of Search .................................. 428/212, 457, 428/469, 689, 699, 701, 702, 930; 174/125.1; 505/230, 236, 237, 238, 239, 701, 704, 705, 231

[56] References Cited

U.S. PATENT DOCUMENTS

| | | | |
|---|---|---|---|
| 3,537,827 | 11/1970 | Benze et al. | 29/194 |
| 4,617,789 | 10/1986 | Borden | 57/6 |
| 4,970,483 | 11/1990 | Wicker et al. | 335/216 |
| 4,973,574 | 11/1990 | Nishio et al. | 505/230 |
| 4,975,416 | 12/1990 | Onishi et al. | 505/420 |
| 4,990,490 | 2/1991 | Pathare et al. | 505/1 |
| 4,994,435 | 2/1991 | Shiga et al. | 505/232 |
| 4,994,633 | 2/1991 | Puh | 174/125.1 |
| 5,059,582 | 10/1991 | Chung | 505/1 |
| 5,116,809 | 5/1992 | Tsuno et al. | 505/1 |
| 5,121,869 | 6/1992 | Knudsen et al. | 228/4.1 |
| 5,151,406 | 9/1992 | Sawada et al. | 505/231 |
| 5,200,390 | 4/1993 | Howng | 505/1 |
| 5,200,391 | 4/1993 | Fisher et al. | 505/1 |
| 5,232,908 | 8/1993 | Shiga et al. | 505/1 |
| 5,299,728 | 4/1994 | King et al. | 228/179.1 |
| 5,312,802 | 5/1994 | Hayashi et al. | 505/211 |
| 5,379,020 | 1/1995 | Meier et al. | 505/211 |
| 5,399,547 | 3/1995 | Negm et al. | 505/430 |
| 5,531,015 | 7/1996 | Manlief et al. | 29/599 |
| 5,801,124 | 9/1998 | Gamble et al. | 505/230 |

OTHER PUBLICATIONS

King et al., "Evaluation of a Strengthening and Insulation System For High Temperature BSCCO–2223 Superconducting Tape", presented at ICMC Conference Jul. 1995.

*Primary Examiner*—Marie Yamnitzky
*Attorney, Agent, or Firm*—Fish & Richardson, P.C.

[57] ABSTRACT

A superconducting ceramic includes a laminate and a superconducting ceramic tape joined to the laminate. The laminate and superconductor tape are joined such that the tape is under a compressive stress. The compressive stress is of a greater amount than the compressive stress which results from differences in thermal expansion of the tape and the laminate. The greater compressive stress can be achieved by putting the laminate under a greater tension than the superconducting ceramic tape during joining of the superconducting ceramic tape to the laminate.

27 Claims, 2 Drawing Sheets

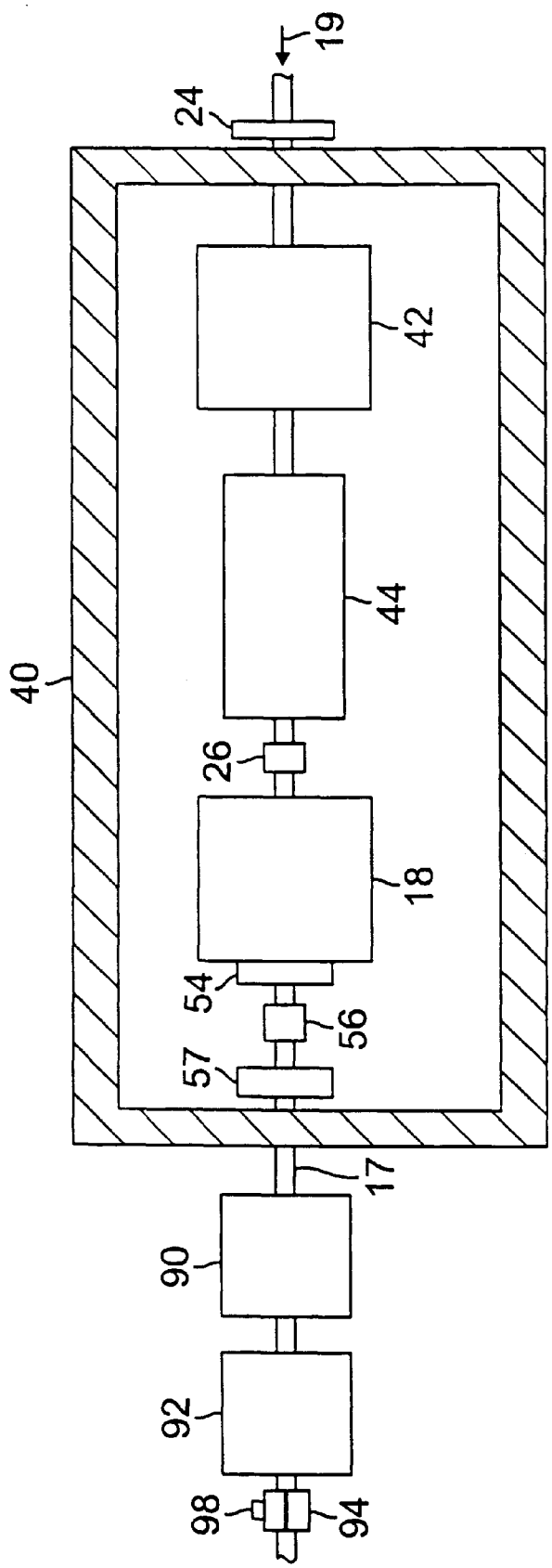
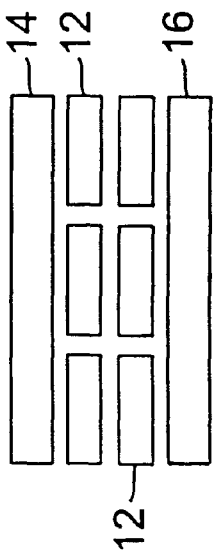
FIG. 3
FIG. 4

LAMINATED SUPERCONDUCTING CERAMIC TAPE

BACKGROUND OF THE INVENTION

The invention relates to superconducting ceramic tapes, and particularly to laminated superconducting ceramic tapes.

When a superconductor tape is put under tension the ceramic grains in the tape degrade resulting in a decrease in the critical current carrying capacity of the superconductor tape. To address this issue, it has been known to form superconductors by laminating the superconductor tape which may be a previously compressively strained tape to a support structure having a thermal expansion coefficient larger than that of the superconducting tape to improve the tape's tolerance to tensile and bending stresses.

SUMMARY OF THE INVENTION

A superconducting ceramic formed by laminating a superconducting ceramic tape to a tensioned laminate results in a superconducting ceramic tape that is under compression and enables higher level of tensile strain to be applied to the superconductor during use without causing degradation of the tapes critical current carrying capacity.

The invention relates to a superconducting ceramic including a laminate and a superconducting ceramic tape joined to the laminate. The laminate and superconductor tape are joined such that the tape is under a compressive stress. The compressive stress is of a greater amount than the compressive stress which results from differences in thermal expansion of the tape and the laminate.

In particular embodiment of the invention, the superconductor tape is under a compressive stress in the range of about 10 to 150 MPa, preferably about 30 to 120 MPa, and most preferably about 60 to 120 MPa. The laminate is a tape formed from stainless steel, copper, copper alloys, or superalloys. Solder or epoxy can be used for joining the superconductor tape to the laminate. A first side of the superconductor tape can be joined to one laminate and a second side of the superconductor tape can be joined to a second laminate.

According to another aspect of the invention, a superconducting ceramic includes a laminate and a superconducting ceramic tape joined to the laminate such that the tape is under compression. The superconducting ceramic can withstand tensile strains in a single bend test of at least 1.5% without degrading current carrying capability of the tape more than 10%, that is below 90% of its unbent value. In another aspect, the superconducting ceramic can withstand tensile strains in a tension test of at least 0.5% and preferably 0.6% without degrading current carrying capability of the tape more than 10%, that is below 90% of its unbent value.

According to additional aspects of the invention, a superconducting coil and a cable conductor are formed from the superconducting ceramic of the invention.

According to yet another aspect of the invention, a superconducting ceramic is formed by joining a superconducting ceramic tape to a laminate. The laminate is at a greater tension than the superconductor tape during joining.

According to another aspect of the invention, an apparatus for laminating a superconducting ceramic tape to a laminate includes a laminator and a feed guide for guiding the superconducting ceramic tape and the laminate along a laminate process path into the laminator. Throughout the laminating process, the radius of curvature of the superconducting ceramic tape is maintained at greater than about 3 inches.

In particular embodiments of the invention, the laminate has a coefficient of thermal expansion greater than that of the superconducting ceramic tape. A heater enables lamination at a predetermined elevated temperature and a cooler cools the superconducting ceramic tape and the laminate thereby placing the tape under compression.

A laminate payoff roll and a superconducting ceramic tape payoff roll are located at an upstream end of the laminate process path. A brake is associated with the laminate payoff roll for tensioning the laminate. A take-up roll including a motor is located at a downstream end of the laminate process path. A second brake is associated with the superconducting ceramic tape payoff roll for independently tensioning the tape. In another aspect of the invention, a second laminate payoff roll including a third brake is located at the upstream end of the laminate process path. The laminates are tensioned at a higher tension than the superconducting tape and the superconducting tape is laminated between the two laminates.

According to another aspect of the invention, an apparatus for laminating a superconducting ceramic tape to a laminate includes a laminator and a feed guide for guiding the superconducting ceramic tape and the laminate along a substantially straight laminate process path into the laminator.

According to yet another aspect of the invention, a method of laminating a superconducting ceramic tape includes the steps of feeding the superconducting ceramic tape through a laminator while maintaining a radius of curvature of the superconducting ceramic tape greater than about 3 inches; feeding a laminate into the laminator; and laminating the superconducting ceramic tape to the laminate.

In particular embodiments of the method of the invention the tape and the laminate are heated during lamination to expand the tape and the laminate. The tape and the laminate are cooled after lamination to put the tape under compression. The laminate is tensioned prior to lamination. A second laminate is fed into the laminator and the superconducting ceramic tape is laminated to the second laminate.

According to another aspect of the invention, a method of laminating a superconducting ceramic tape includes feeding the superconducting ceramic tape through a laminator along a substantially straight path, feeding a laminate into the laminator, and laminating the superconducting ceramic tape to the laminate.

Advantages of the system may include one or more of following. The superconducting ceramic tape is not subject to strains during lamination that would result in degradation of the tape's critical current carrying capacity. Tensions placed on the laminates and on the superconducting ceramic tape are independently controllable to enable a larger tension to be placed on the laminates than on the superconducting ceramic tape.

BRIEF DESCRIPTION OF THE DRAWINGS

Other objects, features and advantages of the invention will be apparent from the following description taken together with the drawings in which:

FIG. 3 is a top sectional view of a nitrogen enclosure of the laminating assembly of FIG. 1; and FIG. 4 is an end view of an additional embodiment of a superconducting ceramic.

DESCRIPTION OF THE PREFERRED EMBODIMENTS

Figure 1:
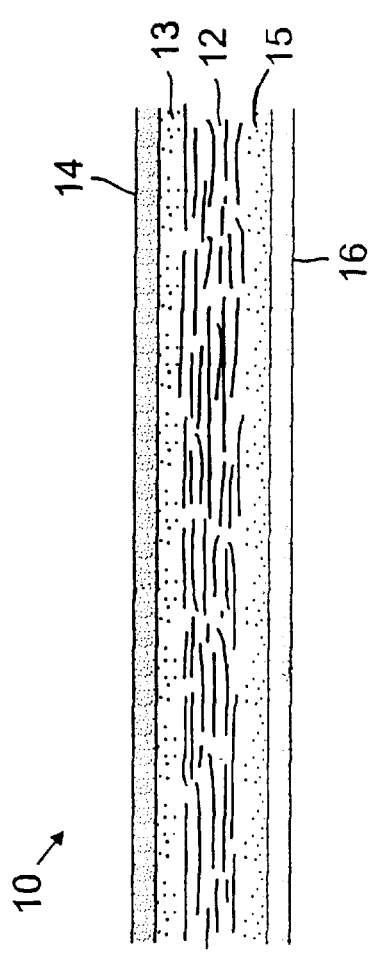
FIG. 1 shows a laminated superconducting ceramic tape.

Referring to FIG. 1, a laminated superconducting ceramic 10 manufactured in accordance with the invention includes a superconducting ceramic tape 12 joined to laminates 14 and 16 by, for example, solder 13 and 15 or epoxy. Solderless mechanical bonding techniques such as ultrasonic welding may also be used.

This laminated superconductor structure can produce an initial amount of compressive stress on tape 12 when laminates 14, 16 are selected to have a higher coefficient of expansion than tape 12. The larger the disparity between the coefficients of expansion of the laminates and the tape, the greater compression the tape is put under as it cools after lamination and thus larger strains can be applied to laminated superconductor 10 without degrading the performance of the superconductor tape.

To further compress tape 12, as described below, in addition to maximizing the coefficient of expansion mismatch between the tape and laminates, laminates 14 and 16 can be tensioned during the laminating process. A tensile stress, for example, about 10–60 MPa, preferably about 30 MPa, corresponding to a strain of about 0.2%, placed on laminates 14, 16 further compresses tape 12 when the tensile stress is eliminated after laminating. Tension on tape 12 is maintained at very low levels during lamination, typically corresponding to a strain of about 0.01% or less, to prevent tape degradation.

Figure 2:
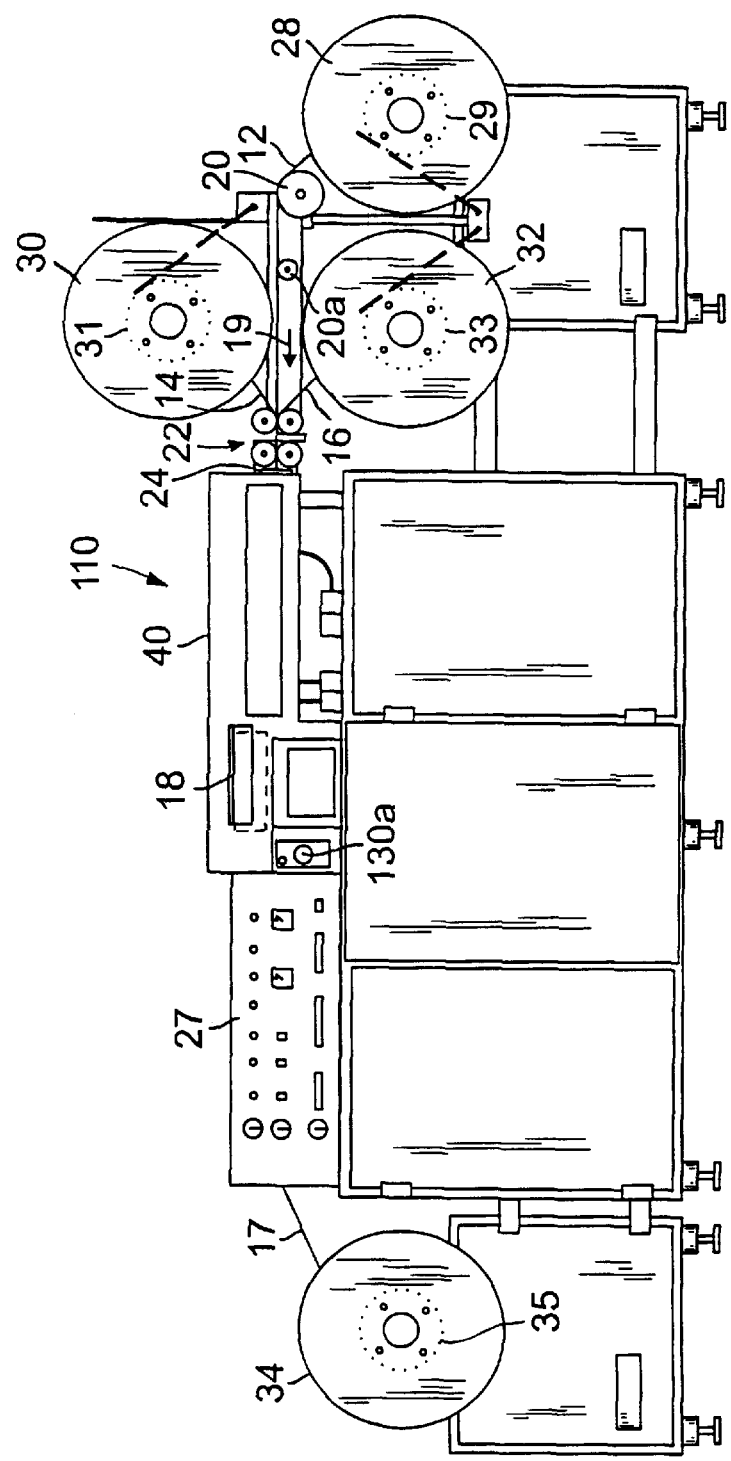
FIG. 2 is a schematic side view of a laminating assembly in accordance with the invention.

Referring to FIG. 2, a laminating assembly 110 for laminating superconducting ceramic tape 12 between laminates 14 and 16 is shown. Laminating assembly 110 includes a laminator 18, for example, a solder wave or solder bath, and a series of feed guides 20, 20a, 22, 24, and 26 (see FIG. 3) for guiding tape 12 and laminates 14, 16 into laminator 18. Tape 12 travels along a substantially straight laminate process path (arrow 19) to prevent degradation of the superconductor tape as it is fed through the feed guides and the laminator and to avoid differential tension on the two sides of the tape.

Tape 12, prior to lamination, is stored on a payoff roll 28. Laminates 14, 16, prior to lamination, are stored on payoff rolls 30, 32, respectively. A take-up roll 34 on which the resulting laminated tape 17 is taken-up is driven by a motor 35 and pulls tape 12 and laminates 14, 16 through the feed guides and laminator. Payoff rolls 28, 30, 32 include brakes 29, 31, 33, respectively, for independently controlling the tension in tape 12 and laminates 14, 16. The radius of curvature of tape 12 as it is fed from payoff roll 28 is maintained at greater than about 3 inches to prevent mechanical, and hence electrical, degradation of the superconductor tape.

Laminating assembly 110 includes an instrument panel 27 for input of user commands and displaying of system status.

Referring to FIG. 3, laminating assembly 110 can include, for example, a nitrogen gas enclosure 40 housing laminator 18, a fluxer 42 located upstream of laminator 18, and a dryer/heater 44 located between fluxer 42 and laminator 18. A guide dam 54 can be used to control the thickness of the solder between laminates 14, 16 and tape 12. A cooler 56 blows air at, for example, 100° C., to remove excess solder from laminated tape 17 and cools the laminated tape to freeze the solder. An additional feed guide 57 is located downstream of cooler 56.

Located downstream of cooler 56 are a clean station 90 which sprays a cleaning fluid, for example, distilled water at about 70° C., over tape laminate 17 and a dryer 92 located downstream of clean station 90 including air jets at about 100° C. Guide rollers 94 are located downstream of dryer 92.

In the manufacturing process, while tape 12 and laminates 14, 16 are heated to a soldering temperature, laminates 14, 16 expand more than tape 12 due to their higher coefficient of expansion. As the laminated tape 17 is cooled, the tape and laminates retract as they start to cool, the solder freezes binding the tape to the laminates, and as the now laminated tape 17 cools below the freezing temperature, laminates 14 and 16 force tape 12 into compression as they retract more than the tape due to their higher coefficient of expansion. Tape 12 is put under further compression as laminated tape 17 cools to room temperature and then is still further compressed in use where it is cooled to about −196° C.

The independently controlled brakes permit the laminates to be tensioned at a higher tension than tape 12 during the lamination process. Upon removal of the tension when lamination is completed, tape 12 is further compressed as the laminates retract toward their rest-lengths.

Tape 12 of laminated superconductor 10 can typically have a width of about 0.02–1.0" or larger, and a thickness of about 0.001–0.040" or larger although smaller tapes may also be used. The tapes may be made by any process for manufacturing superconducting tape, such as the well-known powder-in-tube and coated conductor processes. The invention may be practiced with any superconducting ceramic. They are preferably superconducting oxides, especially superconducting copper oxides of the bismuth, rare earth, thallium, lead or mercury families. Preferred materials include, for example, $(Pb,Bi)_2Sr_2Ca_2Cu_3O$ (BSCCO 2223), $(Pb,Bi)_2Sr_1Ca_1Cu_2O$ (BSCCO 2112), and $Y_1Ba_2Cu_3O_{7-\delta}$ (YBCO 123). Laminates 14, 16 are preferably stainless steel tapes (other tapes, for example, copper, copper alloy or superalloy tapes are also suitable) and typically have a width that is about the same as the width of tape 12 and not more than 0.005" less than that of tape 12. If the width of laminates 14, 16 is more than 0.005" less than the width of tape 12, the superconducting portions along the edge of superconductor 10 do not receive the full benefit of being compressed by laminates 14, 16. Laminates 14, 16 typically have a thickness of about 0.001–0.003" or larger. Thick laminates, greater than about 0.004–0.02", preferably about 0.006", may advantageously be used in high field magnet applications to support large hoop stresses and provide additional thermal mass and to provide an alternate critical current path if the superconducting tape is driven normal.

Laminates 14, 16 preferably have a high yield strength of about 200–800 MPa or larger. The laminated superconducting ceramic 10 has been seen to have increased performance as the ultimate tensile strength of laminates 14, 16 increases permitting higher stress levels to be applied to superconductor 10 without causing plastic deformation of the superconductor. Thin stainless steel laminates having a thickness of about 0.001" advantageously have a higher yield strength than thicker stainless steel laminates and also provide a thin packing factor. The desired solder thickness of the laminated superconductor 10 is typically in the range of about 0.0001–0.001", and most preferably about 0.0002" to about 0.0006".

The compressive stress placed on tape 12 of superconducting ceramic 10 by the mismatch in thermal expansion coefficients and by tensioning the laminates during lamination permits a greater strain to be placed on the superconductor 10 without degradation of current carrying capability as compared to non-compressed tapes and tapes compressed only by the mismatch in thermal coefficients. For example, for superconducting ceramic tapes 12 having a width of 0.16" and a thickness of 0.008" and laminates 14, 16 having a width of 0.16" and a thickness of 0.0015" soldered to either side of a tape while tensioned, in a single bend test at room temperature, 95% of the superconductor tape's original critical current is maintained, when the strain on the laminated tape is about 1.5%, while 95% of its original critical current is maintained, at a strain of only about 0.1 to 0.5% for an unlaminated tape. In a tension test at −196° C., 95% of the superconductor tape's original critical current is maintained at a strain of 0.6% for the laminated tape manufactured according to the invention, while 95% of its original critical current is maintained at a strain of only 0.2% for an unlaminated tape and 95% of its original critical current is maintained at a strain of only 0.3–0.4% for a laminated tape formed without tensioning the laminates during lamination.

Other embodiments are within the following claims.

For example, if in use, a superconductor tape is only to be exposed to bending strains in one direction, laminate can be soldered to only one side of the tape to gain the advantage of withstanding higher applied strain while maintaining critical current carrying capacity. Laminating to one side of the superconducting ceramic tape places that side under compression while the opposite side of the tape is placed under tension. In use, the tape is bent such that the side under compression is tensioned. Additionally, laminates of different thicknesses can be joined to either side of tape 12 to provide a similar result. Laminated superconductors and methods of manufacture thereof are taught in "Improved Structure for Laminated Superconducting Ceramic Composite Conductors and Method of Manufacture", by Bruce B. Gamble, Gilbert N. Riley, Jr., John D. Scudiere, David M. Buczek, Gregory L. Snitchler, and Michael D. Manlief, and filed the same day this application, U.S. patent application Ser. No. 08/701,333, (now U.S. Pat. No. 5,801,124), the entire contents of which is hereby incorporated by reference.

Referring to FIG. 4, multiple stacks of superconducting ceramic tapes 12 can be laminated between laminates 14, 16. This configuration provides a structural aid for supporting the magnetic Lorentz forces seen when a coil is under hoop stress, and provide additional thermal mass and to provide an alternate critical current path if the superconducting tape is driven normal, and is also a potential cost reduction in coil fabrication.

Depending on the dimensions of the superconducting ceramic tape and the laminates, the difference in thermal expansion between the tape and the laminates, and the tension placed on the laminates during lamination, the superconducting ceramic can maintain about 90%, preferably about 95% or greater, of its original critical current capacity under high tensile strains.

Additions, subtractions and other modifications of the illustrated embodiments of the invention will be apparent to those practiced in the art and are within the scope of the following claims.

What is claimed is:

1. A superconducting ceramic, comprising:

a laminate, and a superconducting ceramic tape joined to said laminate such that said superconducting ceramic tape is under a compressive stress, the compressive stress being of a greater amount than a compressive stress due to only differences in thermal expansion of the superconducting ceramic tape and the laminate, wherein the superconducting ceramic tape comprises a superconductor layer and a substrate.

2. The superconducting ceramic of claim 1 wherein the superconducting ceramic tape is under a compressive stress in the range of about 10 to 150 MPa.

3. The superconducting ceramic of claim 1 wherein the superconducting ceramic tape is under a compressive stress in the range of about 30 to 120 MPa.

4. The superconducting ceramic of claim 1 wherein the superconducting ceramic tape is under a compressive stress of about 60 to 120 MPa.

5. The superconducting ceramic of claim 1 wherein said laminate comprises a tape formed from one of stainless steel, copper, copper alloys, and superalloys.

6. The superconducting ceramic of claim 1 further comprising a second laminate, said superconducting ceramic tape having first and second sides, said first side being joined to one of said laminates and said second side being joined to the other of said laminates.

7. The superconducting ceramic of claim 6 further comprising a plurality of superconducting ceramic tapes joined to said laminates.

8. The superconducting ceramic of claim 1 further comprising a plurality of superconducting ceramic tapes joined to said laminate.

9. A superconducting ceramic, comprising:

a laminate, a superconducting ceramic tape joined to said laminate such that said superconducting ceramic tape is under a compressive stress, the compressive stress being of a greater amount than a compressive stress due to only differences in thermal expansion of the superconducting ceramic tape and the laminate, and one of solder and epoxy for joining said superconducting ceramic tape to said laminate.

10. The superconducting ceramic of claim 9 further comprising a plurality of superconducting ceramic tapes joined to said laminate.

11. A superconducting ceramic, comprising:

a laminate, and a superconducting ceramic tape joined to said laminate such that said superconducting ceramic tape is under compression and said superconducting ceramic can withstand tensile strains in a single bend test of at least 1.5% without degrading current carrying capability of said superconducting ceramic tape more than 10%, wherein the superconducting ceramic tape comprises a superconductor layer and a substrate.

12. The superconducting ceramic of claim 11 further comprising a plurality of superconducting ceramic tapes joined to said laminate.

13. A superconducting ceramic, comprising:

a laminate, and a superconducting ceramic tape joined to said laminate such that said superconducting ceramic tape is under compression and said superconducting ceramic can withstand tensile strains in a tension test of at least 0.6% without degrading current carrying capability of said superconducting ceramic tape more than 10%, wherein the superconducting ceramic tape comprises a superconductor layer and a substrate.

14. The superconducting ceramic of claim 13 further comprising a plurality of superconducting ceramic tapes joined to said laminate.

15. A superconducting ceramic, comprising:

a laminate, and a superconducting ceramic tape joined to said laminate such that said superconducting ceramic tape is under compression and said superconducting ceramic can withstand tensile strains in a tension test of at least 0.5% without degrading current carrying capability of said superconducting ceramic tape more than 10%, wherein the superconducting ceramic tape comprises a superconductor layer and a substrate.

16. The superconducting ceramic of claim 15 further comprising a plurality of superconducting ceramic tapes joined to said laminate.

17. A superconducting coil, comprising:

a superconducting ceramic including a laminate, and a superconducting ceramic tape joined to said laminate such that said superconducting ceramic tape is under a compressive stress, the compressive stress being of a greater amount than a compressive stress due to only differences in thermal expansion of the superconducting ceramic tape and the laminate, wherein the superconducting ceramic tape comprises a superconductor layer and a substrate.

18. The superconducting coil of claim 17 further comprising a plurality of superconducting ceramic tapes joined to said laminate.

19. A cable conductor, comprising:

a superconducting ceramic including a laminate, and a superconducting ceramic tape joined to said laminate such that said superconducting ceramic tape is under a compressive stress, the compressive stress being of a greater amount than a compressive stress due to only differences in thermal expansion of the superconducting ceramic tape and the laminate, wherein the superconducting ceramic tape comprises a superconductor layer and a substrate.

20. The superconducting cable conductor of claim 19 further comprising a plurality of superconducting ceramic tapes joined to said laminate.

21. A superconducting ceramic formed by joining a superconducting ceramic tape to a laminate, wherein during joining said laminate is at a greater tension than said superconducting ceramic tape, wherein the superconducting ceramic tape comprises a superconductor layer and a substrate.

22. The superconducting ceramic of claim 21 wherein said superconducting ceramic tape has a higher thermal expansion than said laminate.

23. The superconducting ceramic of claim 21 formed by joining a plurality of superconducting ceramic tapes to said laminate.

24. A superconducting ceramic, comprising:

a laminate, a superconducting ceramic tape joined to said laminate such that said superconducting ceramic tape is under a compressive stress, the compressive stress being of a greater amount than a compressive stress due to only differences in thermal expansion of the superconducting ceramic tape and the laminate, and means for joining the superconducting ceramic tape to the laminate.

25. The superconducting ceramic of claim 24 further comprising a plurality of superconducting ceramic tapes joined to said laminate.

26. A superconducting ceramic, comprising:

a laminate, and a superconducting ceramic tape joined to said laminate such that said superconducting ceramic tape is under a compressive stress, the compressive stress being of a greater amount than a compressive stress due to only differences in thermal expansion of the superconducting ceramic tape and the laminate, wherein the superconducting ceramic tape comprises a superconductor in a sheath.

27. The superconducting ceramic of claim 26 further comprising a plurality of superconducting ceramic tapes joined to said laminate.

* * * * *